United States Patent [19]
Cory et al.

[11] Patent Number: 5,521,504
[45] Date of Patent: May 28, 1996

[54] PULSE SEQUENCE AND METHOD FOR CREATING A RADIO-FREQUENCY MAGNETIC FIELD GRADIENT WITH A SPATIALLY INDEPENDENT PHASE FOR NMR EXPERIMENTS

[75] Inventors: David G. Cory, Winchester; Frank H. Laukien, Lincoln; Werner E. Maas, Billerica, all of Mass.

[73] Assignee: Bruker Instruments, Inc., Billerica, Mass.

[21] Appl. No.: 177,761

[22] Filed: Jan. 4, 1994

[51] Int. Cl.⁶ .................................................... G01V 3/00
[52] U.S. Cl. ............................................ 324/309; 324/307
[58] Field of Search .................................. 324/307, 309, 324/310, 311, 312

[56] References Cited

U.S. PATENT DOCUMENTS 5,229,718  7/1993  Cory .......................... 324/309
5,260,655  11/1993 Cory .......................... 324/309
5,327,087  7/1994  Hafner et al. ................ 324/307

Primary Examiner—Louis M. Arana
Attorney, Agent, or Firm—Bookstein & Kudirka

[57] ABSTRACT

A composite RF pulse is created from a sequence of conventional homogeneous RF pulses and conventional gradient RF pulses and the composite pulse generates a gradient magnetic field with a spatially varying amplitude, but a spatially independent phase. In one embodiment of the invention, the pulse sequence consists of four conventional gradient RF pulses interspersed with two conventional homogeneous RF pulses. In another embodiment of the invention, a conventional gradient RF pulse is combined with a conventional homogeneous RF pulse and the pulse pair is repeated in order to generate an effective magnetic field with a spatially varying amplitude, but a spatially independent phase.

6 Claims, 7 Drawing Sheets

PULSE SEQUENCE AND METHOD FOR CREATING A RADIO-FREQUENCY MAGNETIC FIELD GRADIENT WITH A SPATIALLY INDEPENDENT PHASE FOR NMR EXPERIMENTS

FIELD OF THE INVENTION

This invention relates to nuclear magnetic resonance (NMR) spectroscopy and, in particular, to high resolution NMR experiments utilizing RF gradient pulses.

BACKGROUND OF THE INVENTION

All atomic nuclei of elements with an odd atomic mass or an odd atomic number possess a nuclear magnetic moment. Nuclear magnetic resonance is a phenomenon exhibited by this select group of atomic nuclei (termed "NMR active" nuclei), and is based upon the interaction of the nucleus with an applied, external magnetic field. The magnetic properties of a nucleus are conveniently discussed in terms of two quantities: the gyromagnetic ratio ($\gamma$); and the nuclear spin (I). When an NMR active nucleus is placed in a magnetic field, its nuclear magnetic energy levels are split into (2I+1) non-degenerate energy levels, which are separated from each other by an energy difference that is directly proportional to the strength of the applied magnetic field. This splitting is called the "Zeeman" splitting and the energy difference is equal to $hH_o/2\pi$ where h is Plank's constant and $H_0$ is the strength of the applied magnetic field. The frequency corresponding to the energy of the Zeeman splitting ($\omega=\gamma H_0$) is called the "Larmor frequency" and is proportional to the field strength of the magnetic field. Typical NMR active nuclei include $^1H$ (protons), $^{13}C$, $^{19}F$, and $^{31}P$. For these four nuclei I=½, and each nucleus has two nuclear magnetic energy levels.

When a bulk sample of material containing NMR active nuclei is placed within a magnetic field called the main static field, the nuclear spins distribute themselves amongst the nuclear magnetic energy levels in accordance with Boltzmann's statistics. This results in a population imbalance among the energy levels and a net nuclear magnetization. It is this net nuclear magnetization that is studied by NMR techniques.

At equilibrium, the net nuclear magnetization of the aforementioned bulk sample is aligned parallel to the external magnetic field and is static (by convention, the direction of the main static field is taken to be the z-axis). A second magnetic field perpendicular to the main static magnetic field and rotating at, or near, the Larmor frequency can be applied to induce a coherent motion of the net nuclear magnetization. Since, at conventional main static magnetic field strengths, the Larmor frequency is in the megahertz frequency range, this second magnetic field is called a "radio frequency" or RF field.

The effect of the RF field is to shift the nuclear magnetization direction so that it is no longer parallel to the main static field. This shift introduces a net coherent motion of the nuclear magnetization about the main static field direction called a "nutation". In order to conveniently deal with this nutation, a reference frame is used which rotates about the laboratory reference frame z-axis at the Larmor frequency and also has its z-axis parallel to the main static field direction. In this "rotating frame" the net nuclear magnetization, which is rotating in the stationary "laboratory" reference frame, is now static.

Consequently, the effect of the RF field is to rotate the now static nuclear magnetization direction at an angle with respect to the main static field direction (z-axis). The new magnetization direction can be broken into a component which is parallel to the main field direction (z-axis direction) and a component which lies in the plane transverse to the main magnetization (x,y plane). The RF field is typically applied in pulses of varying length and amplitude and, by convention, an RF pulse of sufficient amplitude and length to rotate the nuclear magnetization in the rotating frame through an angle of 90°, or $\pi/2$ radians, and entirely into the x,y plane is called a "$\pi/2$ pulse".

Because the net nuclear magnetization is rotating with respect to the laboratory frame, the component of the nuclear magnetization that is transverse to the main magnetic field or that lies in the x,y plane rotates about the external magnetic field at the Larmor frequency. This rotation can be detected with a receiver coil that is resonant at the Larmor frequency. The receiver coil is generally located so that it senses voltage changes along one axis (for example, the x-axis) where the rotating magnetization component appears as an oscillating voltage. Frequently, the "transmitter coil" employed for applying the RF field to the sample and the "receiver coil" employed for detecting the magnetization are one and the same coil.

Although the main static field is applied to the overall material sample, the nuclear magnetic moment in each nucleus within the sample actually experiences an external magnetic field that is changed from the main static field value due to a screening from the surrounding electron cloud. This screening results in a slight shift in the Larmor frequency for that nucleus (called the "chemical shift" since the size and symmetry of the shielding effect is dependent on the chemical composition of the sample).

In a typical NMR experiment, the sample is placed in the main static field and a $\pi/2$ pulse is applied to shift the net magnetization into the transverse plane (called transverse magnetization). After application of the pulse, the transverse magnetization, or "coherence", begins to precess about the x-axis, or evolve, due to the chemical shifts at a frequency which is proportional to the chemical shift field strength. In the rotating frame, the detector (which is stationary in the laboratory frame) appears to rotate at the Larmor frequency. Consequently, the detector senses an oscillation produced by an apparent magnetization rotation at a frequency which is proportional to the frequency difference between the Larmor frequency and the chemical shift frequency.

Thus, the detected signal oscillates at the frequency shift difference. In addition to precessing at the Larmor frequency, in the absence of the applied RF field energy, the nuclear magnetization also undergoes two spontaneous processes: (1) the precessions of various individual nuclear spins which generate the net nuclear magnetization become dephased with respect to each other so that the magnetization within the transverse plane loses phase coherence (so-called "spin-spin relaxation") with an associated relaxation time, $T_2$, and (2) the individual nuclear spins return to their equilibrium population of the nuclear magnetic energy levels (so-called "spin-lattice relaxation") with an associated relaxation time, $T_1$. The latter process causes the received signal to decay to zero. The decaying, oscillating signal is called a free induction decay (FID).

Many NMR experiments are designed such that the spin dynamics are uniform through the sample and, in these cases, the sample is placed in a uniform magnetic field. However, there are cases where it is advantageous to impose a spatial variation in the spin dynamics across the sample. Obvious examples of such cases include imaging experiments and diffusion experiments. The spin evolution may also be spatially modulated as a means of selecting a specific coherence pathway or multiple quantum spin state. Such a spatial variation may be introduced into an experiment by utilizing a magnetic field having a spatial variation (such as a linear gradient) to perform the experiment. Two magnetic fields are commonly employed in NMR experiments, $B_0$ and $B_1$ fields, which are fields that are oriented along the direction of the main static field and in the plane transverse to the main static field direction, respectively.

$B_1$-gradients are commonly generated by a special RF coil which produces a magnetic field that has at least one component with a direction lying in the plane perpendicular to the main static field direction. When $B_1$-gradient magnetic fields are used in NMR spectroscopy experiments, the gradient magnetic field is often used in conjunction with a homogeneous RF magnetic field which is also generated by an RF coil. The homogeneous field and the gradient field can be generated either by two different RF coils or by a single coil which can alternately be driven in a gradient mode and a homogeneous mode.

An example of the use of $B_1$-gradients in NMR spectroscopy has been described in detail in a paper entitled "The Selection of Coherence-Transfer Pathways by Inhomogeneous Z Pulses" by C. J. R. Counsell, M. H. Levitt and R. R. Ernst, *Journal of Magnetic Resonance*, v.64, pages 470–478, 1985. Another example of the use of $B_1$-gradients in NMR spectroscopy has been described in detail in another paper entitled "The Equivalent of the DQF-COSY Experiment, with One Transient Per $t_1$ Value, by Use of $B_1$ Gradients", by J. Brondeau, D. Boudot, P. Mutzenhardt and D. Canet, *Journal of Magnetic Resonance*, v. 100, pp. 611–618, 1992. $B_1$ gradients have also been used for imaging by M. H. Werner and this approach is described in detail in a Ph.D. dissertation entitled, "NMR Imaging of Solids with Multiple-Pulse Line Narrowing and Radiofrequency Gradients" (M. H. Werner: Ph.D. Thesis, California Institute of Technology, Pasadena, Calif., 1993).

Since the spin dynamics are relative to the homogeneous RF field whose phase may itself vary over the sample, it is understood that it is the uniformity of the relative phase difference between the gradient and the homogeneous RF fields which is important. To simplify this discussion, however, the homogeneous RF field is discussed as though it generated an ideal uniform field.

An ideal field having a constant spatial field direction (or spatially-independent phase) can, in principle, be generated by means of an RF coil with proper geometry. However, practical requirements, such as RF efficiency, the frequency at which the coil is operated, and physical limitations on the size and placement of the gradient RF coil generally make it nearly impossible to generate an RF gradient magnetic field with a truly spatially independent phase.

For many applications involving $B_1$-gradients, the spatial variation of the magnetic field should ideally be only a variation in magnitude of the field, with the direction of the field, or the phase, remaining constant over space. A spatial dependence of the phase causes signal reduction and artifacts in experiments where the $B_1$-gradient field is used in combination with a homogeneous RF field.

Accordingly, it is an object of the present invention to provide a pulse sequence that converts an RF gradient field with a spatial variation in both amplitude and phase to an RF gradient field with a spatially dependent amplitude and a spatially independent phase.

SUMMARY OF THE INVENTION

The foregoing problems are overcome and the foregoing object is achieved in an illustrative embodiment of the invention in which a composite RF pulse is created from a sequence of homogeneous pulses and gradient pulses. The composite pulse generates a gradient magnetic field with a spatially varying amplitude, but a spatially independent phase. The creation of a $B_1$-gradient with a spatially independent phase allows for a simple and direct use of the $B_1$-gradient in a manner analogous to the use of a $B_0$ gradient in many known experiments (such as multiple quantum filters, quadrature detection and imaging experiments). Additional advantages are that the gradient pulse is a simple sequence of RF pulses, switching times are short, the lock channel is not affected, there is no need for pre-emphasis, the lineshape is not distorted, no eddy currents are induced and the gradient is frequency-selective.

In one embodiment of the invention, the pulse sequence consists of four conventional gradient RF pulses interspersed with two conventional homogeneous RF pulses. In another embodiment of the invention a conventional gradient RF pulse is combined with a conventional homogeneous RF pulse and the pulse pair is repeated in order to utilize the principle of second averaging to average the gradient pulse phase to zero.

DETAILED DESCRIPTION OF THE PREFERRED EMBODIMENTS

Figure 1:
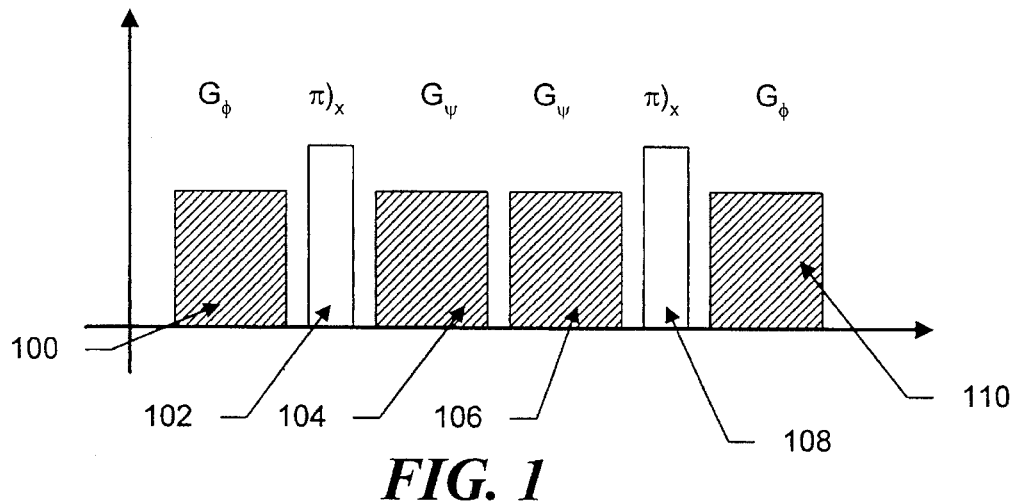
FIG. 1 is an illustrative RF pulse sequence constructed in accordance with the principles of the invention and based on homogeneous π pulses, which eliminates the spatial dependence of the phase of the RF gradient.

The RF magnetic field, $B_1(\vec{r},t)$, generated in a conventional gradient RF coil can be described as:

$$B_1(\vec{r},t) = B_1^c(t) + B_1^g(\vec{r},t) \tag{1}$$

where $B_1^c(t)$ is a spatially invariant contribution and $B_1^g(\vec{r},t)$ is the gradient term, which varies over space. Each term on the right-hand side of the equation can be expressed in three orthogonal components with respect to the local frames of the spins:

$$B_1(\vec{r},t) = \hat{e}_x B_x^c(t) + \hat{e}_y B_y^c(t) + \hat{e}_z B_z^c(t) + \hat{e}_x B_x^g(\vec{r},t) + \hat{e}_y B_y^g(\vec{r},t) + \hat{e}_z B_z^g(\vec{r},t) \tag{2}$$

where the z-axis is chosen along the direction of the main magnetic field and the terms $\hat{e}_x$, $\hat{e}_y$, $\hat{e}_z$ are unit vectors in the x, y and z directions of the laboratory frame. Since only the transverse terms of the RF magnetic field couple into the spin system, the z-components of the field will be neglected from here on. It is further assumed that the spatially invariant field is aligned along the x-axis; there is no loss in generality introduced with this choice of reference frame. The spatially dependent fields can be expressed in terms of gradients $\partial Bi/\partial \alpha$ where $i = x, y$ and $\alpha = u, v, z$ are the directions of the laboratory frame which is fixed with respect to the RF coil:

$$B_i^g(\vec{r},t) = u \frac{\partial Bi}{\partial u} + v \frac{\partial Bi}{\partial v} + z \frac{\partial Bi}{\partial z} \tag{3}$$

The time dependence of the oscillating RF field can be expressed as $\cos(\omega t + \phi)$ where $\omega$ is the rotation frequency and $\phi$ is the phase angle of the RF field. The RF field can then be decomposed into a rotating component (arbitrarily referred to as clockwise, CW) and a counter-rotating component (counter-clockwise, CCW):

$$\hat{e}_x \cos(\omega t + \phi) = \frac{1}{2}[\hat{e}_x \cos(\omega t + \phi) + \hat{e}_y \sin(\omega t + \phi)] + ; \Leftarrow CCW$$

$$\frac{1}{2}[\hat{e}_x \cos(\omega t + \phi) - \hat{e}_y \sin(\omega t + \phi)] + ; \Leftarrow CW \tag{4}$$

$$\hat{e}_y \cos(\omega t + \phi) = \frac{1}{2}[\hat{e}_y \cos(\omega t + \phi) + \hat{e}_x \sin(\omega t + \phi)] + ; \Leftarrow CCW$$

$$\frac{1}{2}[\hat{e}_y \cos(\omega t + \phi) - e_x \sin(\omega t + \phi)] + ; \Leftarrow CW \tag{5}$$

Only those components that rotate in the same direction as the spins couple into the spin system. Therefore, one of the rotating components can be neglected, and, in the following discussion, only the counter clockwise (CCW) components will be preserved.

If $B_1$ is the strength of the RF field, then the resulting magnetic field can be expressed as:

$$B_1(\vec{r},t) = B_1\{\hat{e}_x \cos(\omega t + \phi) + \hat{e}_y \sin(\omega t + \phi)\} + \tag{6}$$

$$B_1 \left[ u \frac{\partial B_x}{\partial u} + v \frac{\partial B_x}{\partial v} + z \frac{\partial B_x}{\partial z} \right] [\hat{e}_x \cos(\omega t + \phi) + \hat{e}_y \sin(\omega t + \phi)] +$$

$$B_1 \left[ u \frac{\partial B_y}{\partial u} + v \frac{\partial B_y}{\partial v} + z \frac{\partial B_y}{\partial z} \right] [\hat{e}_y \cos(\omega t + \phi) - \hat{e}_x \sin(\omega t + \phi)]$$

The total RF magnetic field generated by the gradient coil thus consists of a spatially invariant or homogeneous term and two orthogonal spatially dependent or gradient contributions. In order to simplify the equations, and, for convenience, the phase $\phi$ of the RF can be set to zero and the gradient terms of the x and y components can be written as $G_x$ and $G_y$ respectively, where $$G_i = u \frac{\partial B_i}{\partial u} + v \frac{\partial B_i}{\partial v} + z \frac{\partial B_i}{\partial z}, i = x, y.$$

Then the magnitude $|B|$ and phase $\xi$ of the resultant RF magnetic field at location $\vec{r}$ and time $t = 0$ are given by:

$$|B(\vec{r})| = B_1 \sqrt{(1 + G_x)^2 + G_y^2} \tag{7}$$

$$\tan \xi(\vec{r}) = \frac{G_y}{(1 + G_x)} \tag{8}$$

From these equations, it is clear that, in general, both the magnitude and phase of the resultant magnetic field generated at a point by the RF field are spatial functions dependent on the location of the point within the RF coil.

The present invention uses a combination of gradient RF pulses and homogeneous RF pulses to produce a combined field which retains only the spatial dependence in the magnitude of the magnetic field; the spatial dependence of the phase behavior of the magnetic field disappears. The spatially-independent phase behavior will be called a "pure" phase. In accordance with the principles of the invention, a homogeneous RF field is generated and combined with the conventional RF gradient field to selectively retain one component of the gradient field while averaging the orthogonal component substantially to zero. The generation of the homogeneous and gradient fields requires the use of either two coils, a conventional gradient RF coil and a conventional homogeneous RF coil, or a single coil which can be driven in either a gradient mode or a homogeneous mode by means of switching circuits. A suitable NMR probe is described in detail in U.S. Pat. No. 5,323,113 which is hereby incorporated by reference.

In order to understand the combined effect of the gradient pulses and homogeneous pulses on the spin system, the interaction of the RF field with the spin system in a material can be described by an operator. It is common practice to express the operator in the coordinates of a frame rotating with the frequency of the RF irradiation around the z-axis. The Hamiltonian $H_h$ for an RF field with phase $\theta$ which is generated by a homogeneous coil or a coil operated in a homogeneous mode is given by:

$$H_h = -\gamma B_{1h}\{I_x \cos\theta + I_y \sin\theta\} \tag{9}$$

where $\gamma$ is the gyromagnetic ratio of the material, $B_{1h}$ is the magnitude of the RF field and $I_x$ and $I_y$ are the spin angular momentum operators.

By convention, an x-pulse is defined as an RF pulse with a phase $\theta = 0$ and y, $-x$, and $-y$ pulses are defined as RF pulses with phases $\theta = 90$, 180 and 270 degrees, respectively. Using these definitions, the Hamiltonian $H_g$ for an RF field with phase $\phi$ and amplitude $B_{1g}$ which is generated by a gradient coil or a coil operated in a gradient mode is given by:

$$H_g = -\gamma B_{1g} \{I_x\cos\phi + I_y\sin\phi\} + \quad (10)$$

$$-\gamma B_{1g}G_x \{I_x\cos\phi + I_y\sin\phi\} +$$

$$\gamma B_{1g}G_y \{I_y\cos\phi - I_x\sin\phi\}$$

where $\gamma$ is the gyromagnetic ratio and $G_x$ and $G_y$ are the gradient terms previously defined.

In the multiple pulse cycles described below, the homogeneous RF field will define the symmetry of the experiment. Two pulse sequences will be discussed, one based on the refocussing properties of a conventional Carr-Purcell RF pulse sequence and another based on a mechanism called "second averaging". Both sequences can be conveniently analyzed using a technique called average Hamiltonian theory.

The first inventive RF composite pulse comprises the six RF pulses as follows:

$$G_\phi\text{-}\pi)_x\text{-}G_\psi\text{-}G_\psi\text{-}\pi)_{\bar{x}}\text{-}G_\phi \quad (11)$$

where $G_\phi$ and $G_\psi$ are gradient RF pulses with phases $\phi$ and $\psi$, respectively, and $\pi)_x$ and $\pi)_{\bar{x}}$ are homogeneous RF pulses, with a rotation angle of $\pi$ radians and phases x and $-x$, respectively. An illustrative pulse cycle is diagrammed in FIG. 1 which illustrates the six pulse sequence of line (11). The pulses are illustrated as a function of time increasing to the right. The gradient pulses comprise pulses 100, 104, 106 and 110 and the homogeneous pulses comprise pulses 102 and 108.

The averaged Hamiltonian for this pulse sequence, which is valid for small gradient evolution, is given by:

$$<H> = \quad (12)$$

$$-\gamma B_{1g}\left[(1+G_x)\cos\left(\frac{\phi+\psi}{2}\right) - G_y\sin\left(\frac{\phi+\psi}{2}\right)\right] \times$$

$$\left[I_x\cos\left(\frac{\phi-\psi}{2}\right) + I_y\sin\left(\frac{\phi-\psi}{2}\right)\right]$$

This averaged Hamiltonian is equal to the Hamiltonian for an RF field with phase:

$$\frac{\phi-\psi}{2} \quad (13)$$

and magnitude:

$$B_{1g}\sqrt{(1+G_x)^2\cos^2\left(\frac{\phi+\psi}{2}\right) + G_y^2\sin^2\left(\frac{\phi+\psi}{2}\right)} \quad (14)$$

As shown by equations (13) and (14), the phase of the resultant gradient field is no longer dependent on the location in the gradient coil, and the spatial dependence is entirely contained in the magnitude of the resultant field (in the terms $G_x$ and $G_y$). Thus, this inventive sequence can be used in place of conventional gradient pulses in an NMR experiment to achieve a $B_1$ gradient with a spatially-independent phase.

A second illustrative approach used in accordance with the present invention to achieve a gradient RF field with a spatially independent phase, employs a phenomenon called "second averaging". The principle of second averaging is described in detail in a publication entitled "Quantitative Aspects of Coherent Averaging. Simple Treatment of Resonance Offset Processes in Multiple-Pulse NMR", A. Pines and J. Waugh, *Journal of Magnetic Resonance*, v. 8, pps. 354–365, 1972.

Figure 2:
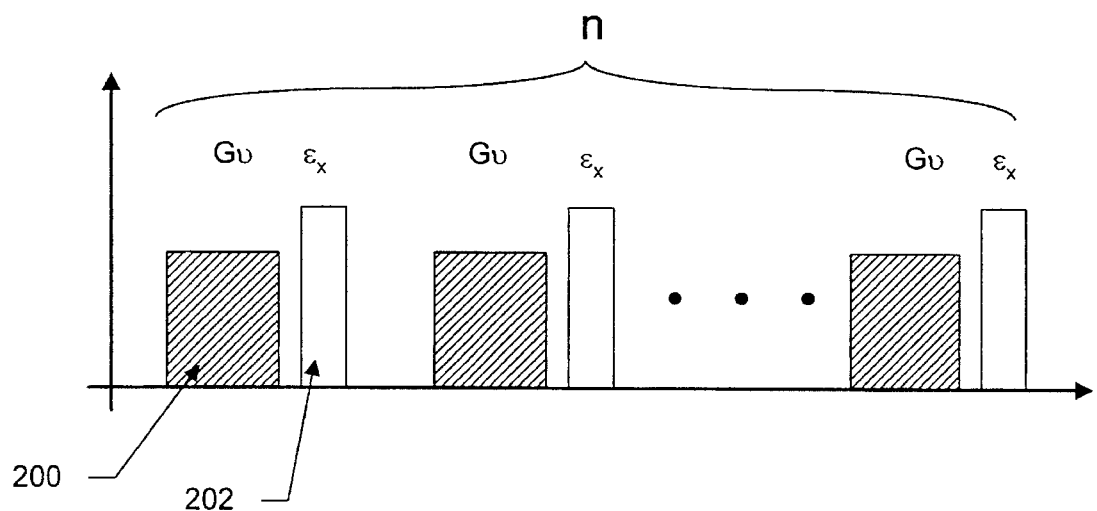
FIG. 2 is an alternative RF pulse sequence constructed in accordance with the principles of the invention and based on second averaging principles which pulse sequence eliminates the spatial dependence of the phase of the RF gradient.

According to the principles of second averaging, a rotation produced by a small gradient interaction can be time-averaged to zero by introducing a large interaction into the gradient sequence, which large interaction produces a rotation that is orthogonal to the rotation generated by the small interaction. The effect of the small rotation is equivalent to a perturbation on the large rotation so that the small interaction is time-averaged. By suitably selecting the large interaction, the small interaction can be averaged substantially to zero. For example, a pulse sequence which has a gradient term as the small interaction and a suitable large interaction is the pulse sequence:

$$(G_\phi\text{-}\epsilon_x)_n \quad (15)$$

in which $G_\phi$ is a gradient RF pulse with phase $\phi$ and $\epsilon_x$ is a homogeneous x-pulse with rotation angle $\epsilon$, and the sequence is repeated n times. A pulse sequence illustrating this new sequence is diagrammed in FIG. 2 where pulse 200 is the gradient pulse and pulse 202 is the homogeneous pulse. The averaged Hamiltonian for this sequence is:

$$<H>=-\gamma B_{1g}I_x[(1+G_x)\cos\phi - G_y\sin\phi] \quad (16)$$

The average Hamiltonian in equation (16) is equal to the Hamiltonian for an RF field with phase 0 and magnitude $B_{1g}\sqrt{(1+G_x)^2\cos^2\phi + G_y^2\sin^2\phi}$. Therefore, the phase of the resulting gradient field produced by this sequence is spatially independent, and all of the spatially-dependent terms are contained in the field magnitude.

The principles of the present invention are illustrated below by three examples: a COSY experiment involving P/N type selection, an RF imaging experiment and a multiple quantum filtering experiment. A COSY experiment is a well-known two-dimensional homonuclear experiment that maps out the scalar coupling network between nuclear spins. Common problems encountered in this type of experiment include axial peaks, mirrored peaks and instrument artifacts. The axial peaks are generated by magnetization which did not evolve during the evolution period. The mirrored peaks cause the two dimensional spectrum to appear as a mirror image of itself (the two sets of peaks are called P-type and N-type) and occur since the experiment cannot distinguish the sense (clockwise or counterclockwise) of the magnetization rotation during the evolution period. These problems are conventionally dealt with by using one of three techniques. The first technique involves cycling the phases of the RF pulses in a predetermined way and coherently adding the results of several experiments. This adding process eliminates axial peaks and selects one set of resonances (P-type or N-type). The problem with phase cycling is that several scans, each with a different phase, must be conducted to generate a single data point and, if a single scan has a sufficient signal-to-noise ratio to generate acceptable data, phase cycling leads to inefficient use of spectrometer time.

An alternative technique to phase cycling employs $B_0$ gradients, to eliminate axial peaks and select P- or N-type resonances. This latter technique is described in detail in a paper entitled "Pulsed Field Gradients in NMR. An alternative to Phase Cycling" by P. Barker and R. Freeman, *Journal of Magnetic Resonance*, v. 64, pps. 334–338, 1985 and the RF pulse sequence for this experiment is depicted in FIG. 3.

Figure 3:
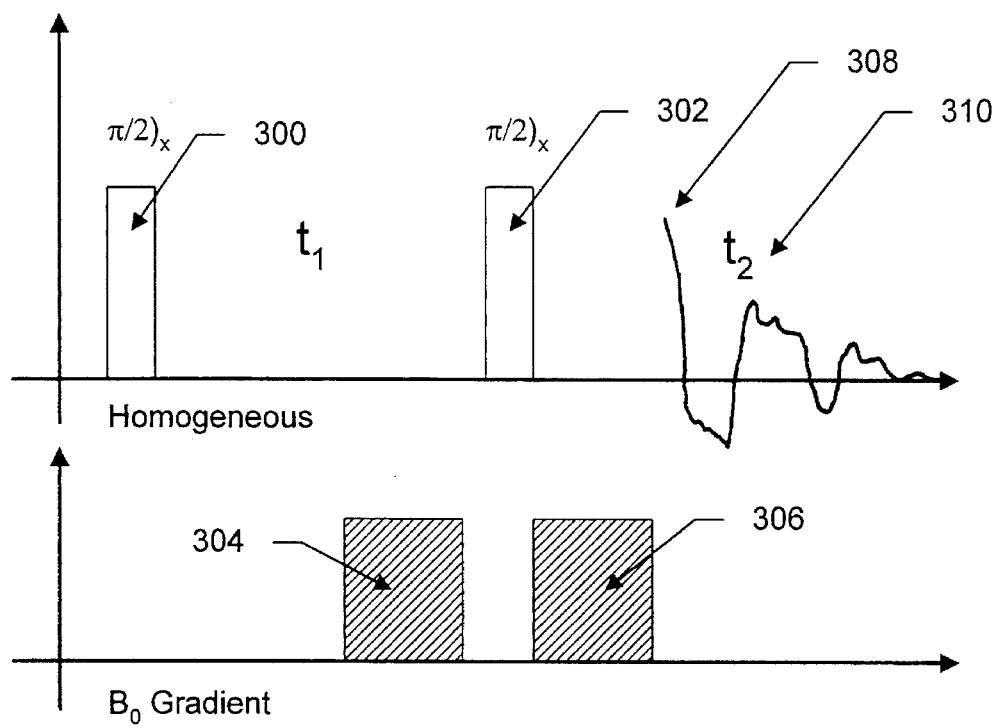
FIG. 3 is the pulse diagram of a prior art P-type selected COSY experiment, using $B_0$-gradients.

As shown in FIG. 3, the pulse sequence comprises two homogeneous $$\left.\frac{\pi}{2}\right)_x$$

pulses 300 and 302 separated by a time interval $t_1$. $B_0$ gradient pulses 304 and 306 are applied both before and after the second homogeneous pulse 302 and an FID 308 is collected during the $t_2$ time interval 310.

The third technique uses $B_1$ gradients generated by RF pulses to eliminate axial peaks and select P- or N-type resonances. For example, the evolution of a spin system under an inhomogeneous static field or $B_0$ gradient can be described as a rotation of the spins about the z-axis of the rotating frame where the angle of rotation is a function of position. As described in detail in a paper entitled "The Selection of Coherence-Transfer Pathways by Inhomogeneous Z Pulses" by C. J. R. Counsell, M. H. Levitt and R. R. Ernst, *Journal of Magnetic Resonance*, v.64, pages 470–478, 1985, it is known that a similar effect can be achieved with an RF gradient field by incorporating an RF gradient pulse in a composite pulse sequence such as:

$$\left.\frac{\pi}{2}\right)_\phi - \theta)_{\phi+\pi/2} - \left.\frac{\pi}{2}\right)_{\phi+\pi}, \text{ where } \left.\frac{\pi}{2}\right)_\phi$$

is a homogeneous $\pi/2$ pulse with phase $\phi$, $\theta$ represents an RF gradient pulse with phase $\phi+\pi/2$ and which produces a rotation angle that is a function of the location of the spins in the gradient coil and $$\left.\frac{\pi}{2}\right)_{\phi+\pi}$$

is a homogeneous $\pi/2$ pulse with phase $\phi+\pi$. By sandwiching the gradient between two homogeneous $\pi/2$ pulses, this composite pulse sequence can also be viewed as switching the evolution plane of the spins due to the RF gradient from perpendicular to the applied RF field to perpendicular to the static magnetic field.

To complete the analogy between $B_0$ and $B_1$ gradients, a planar variation of the RF field over the sample is required. Therefore, the phase of the RF gradient has to be independent of the spatial location in the coil. In the implementation of the composite pulse discussed in the *Counsell et al.* paper referenced above, the RF gradient pulse was generated with a normal RF coil by exploiting the residual inhomogeneity of the coil to produce the required gradient. However, in accordance with the invention, a dual coil configuration can be used in which the gradient strength is optimized by suitably designing the geometry of the gradient coil. In a two coil configuration, however, the phases of the homogeneous and gradient fields cannot be assumed to be identical.

More particularly, spatial independence of the RF phase can be achieved with the inventive pulse sequences as previously discussed. In the experiment described below, the aforementioned composite pulse cycle: $G_\phi$-$\pi_x$-$G_\psi$-$G_\psi$-$\pi$ $\bar{x}$-$G_\phi$ is used and the phases $\phi$ and $\psi$ of the gradient pulses are chosen equal, in which case the averaged Hamiltonian is proportional to $I_x$ and represents a planar gradient. This composite pulse can be used by sandwiching it between two homogeneous $\pi/2$ pulses of opposite phase as discussed above to produce the pulse sequence diagrammed in FIG. 4.

Figure 4:
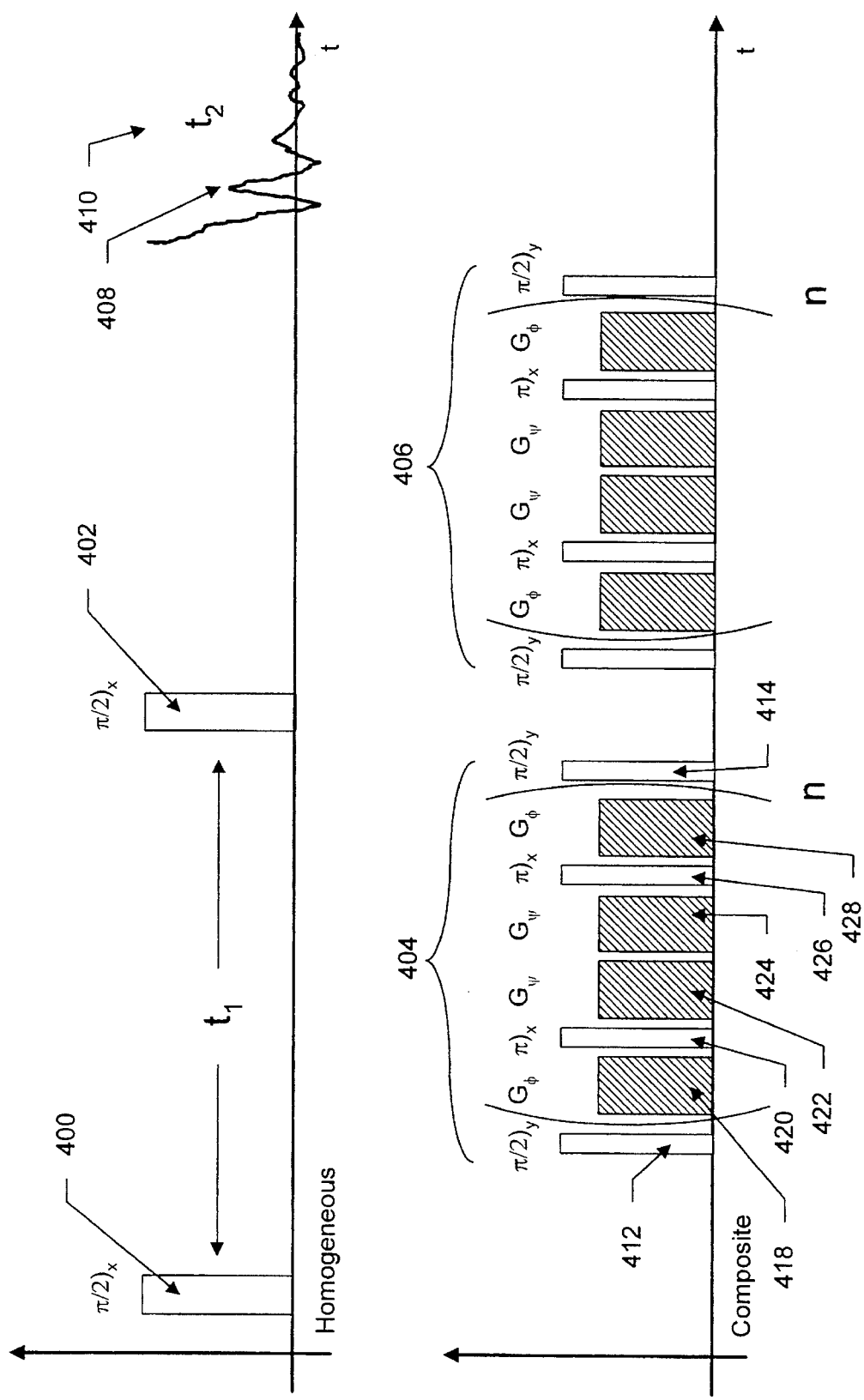
FIG. 4 is the pulse diagram of a pulse sequence used in an N-type selected COSY experiment, using $B_1$-gradients in composite z-rotations.

As shown in FIG. 4, the basic homogeneous pulse sequence is the same as in the prior art sequence using $B_0$ gradients and comprises two homogeneous $\pi/2$ pulses 400 and 402 separated by a time interval $t_1$. RF gradient pulses 404 and 406, which produce a composite z-rotation, are applied both before and after the second homogeneous pulse 402 and, for N-type selection, are equal. An FID 408 is collected during the $t_2$ time interval 410. The RF gradient pulses 404 and 406 are, in turn, comprised of a composite pulse consisting of two homogenous pulses of opposite phase, 412 and 414 which sandwich one or more composite pulses. Each composite pulse comprises the plurality of pulses located within the parentheses and the notation $(\ )_n$ indicates one or more reptitions of the composite pulse. More specifically, the composite pulse is comprised of one of the inventive pulse sequences discussed above. The particular pulse sequence shown in FIG. 4 corresponds to that shown in equation (11) above and comprises gradient pulses 418, 422, 424 and 428 and homogeneous pulses 420 and 426. Alternatively, the pulse sequence shown in equation (15) could also be used.

Figure 5A:
FIG. 5A is a conventional NMR spectrum of 1-chloro, 3-nitrobenzene in deuterated benzene
Figure 5B:
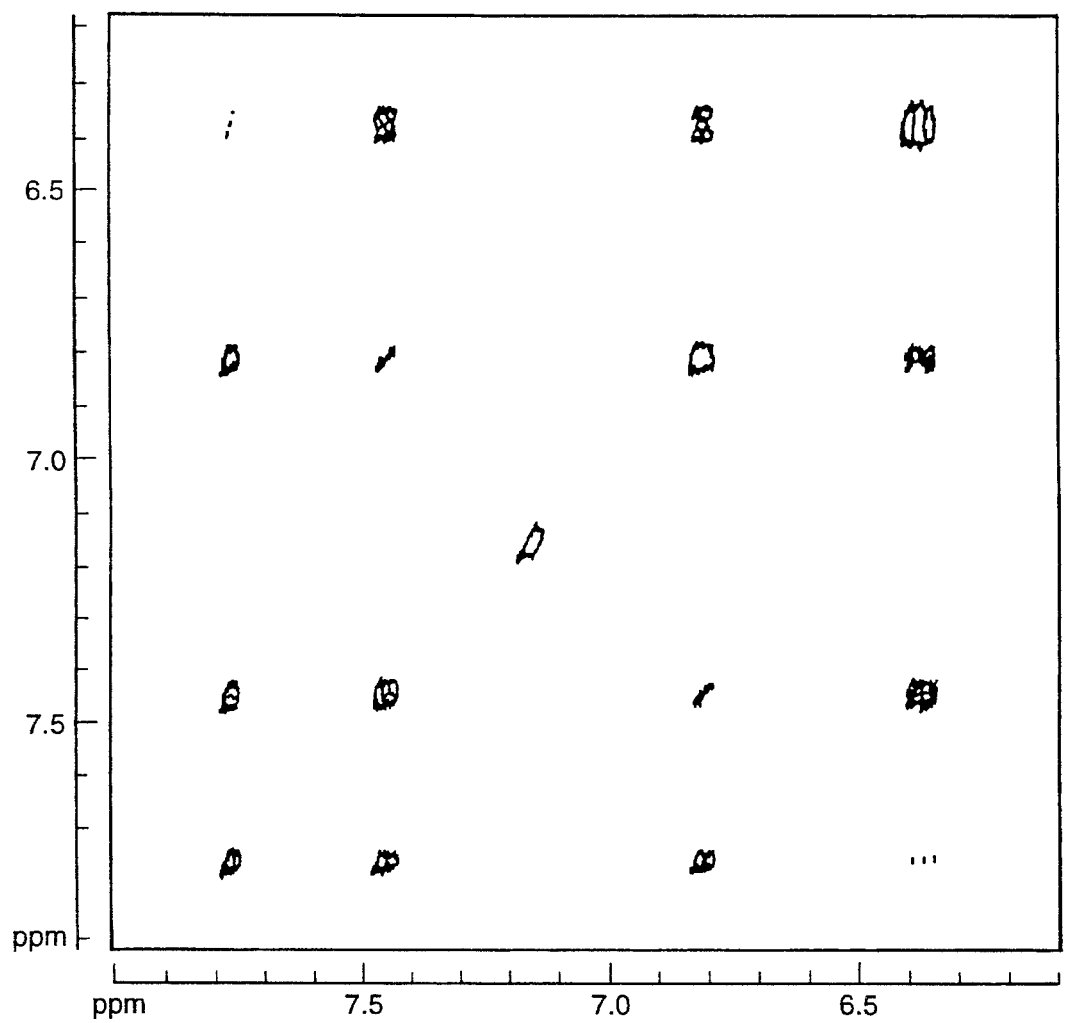
FIG. 5B is an N-type selected proton COSY spectrum of 1-chloro, 3-nitrobenzene in deuterated benzene.

The total effect of the pulse sequence in FIG. 4 is a composite z-rotation where the rotation angle is a function of position in the transverse plane. Note, that the sequence does not work if the phase of the RF gradient is spatially dependent, since the composite z-rotation requires the phases of the RF gradient pulses and the pulse sandwich to be perpendicular FIGS. 5A and 5B show the N-type proton COSY spectrum of 1-chloro,3-nitrobenzene in deuterated benzene, obtained with a single scan per $t_1$ increment using the inventive pulse sequence shown in FIG. 4. The spectrum was obtained with a model AMX 400 spectrometer sold by Bruker Instruments, Inc. 19 Fortune Drive, Manning Park, Billerica, Mass. 01821 operating at a proton resonance of 400 MHz. The experiment utilized a single RF coil driven by the same transmitter by means of active switching and capable of generating an RF gradient strength (measured in a nutation experiment) of 60 kHz/cm (14 G/cm). The total duration of the composite gradient pulse was 4 ms and 256 $t_1$ increments were used with a single scan per increment. All data points were acquired without sample spinning and the data were processed by sine multiplication in both domains followed by a complex Fourier transformation. The data in FIGS. 5A and 5B are presented in magnitude mode; a conventional spectrum is shown in FIG. 5A and a spectrum taken using the inventive pulse sequence is shown in FIG. 5B. The spectrum of FIG. 5B shows a complete suppression of the mirror diagonal, indicating a successful N-type selection.

A second example illustrating the use of the inventive pulse sequences involves imaging of a sample by RF gradients. In particular, a spatially-varying RF magnetic field can be used to map the spatial distribution of spins inside the gradient coil. If the amplitude of the RF field varies over space, then spins at different locations experience an RF field with a different strength and they will therefore precess with a different rotation frequency $\omega_{RF}=\gamma B_1(\vec{r})$ around the local direction of the RF field. This precession frequency can be measured in a so-called "nutation" experiment. The resulting nutation spectrum will then show a distribution of the RF amplitudes across the gradient coil, multiplied by a density function which represents the number of spins at a particular location in the coil.

Figure 6:
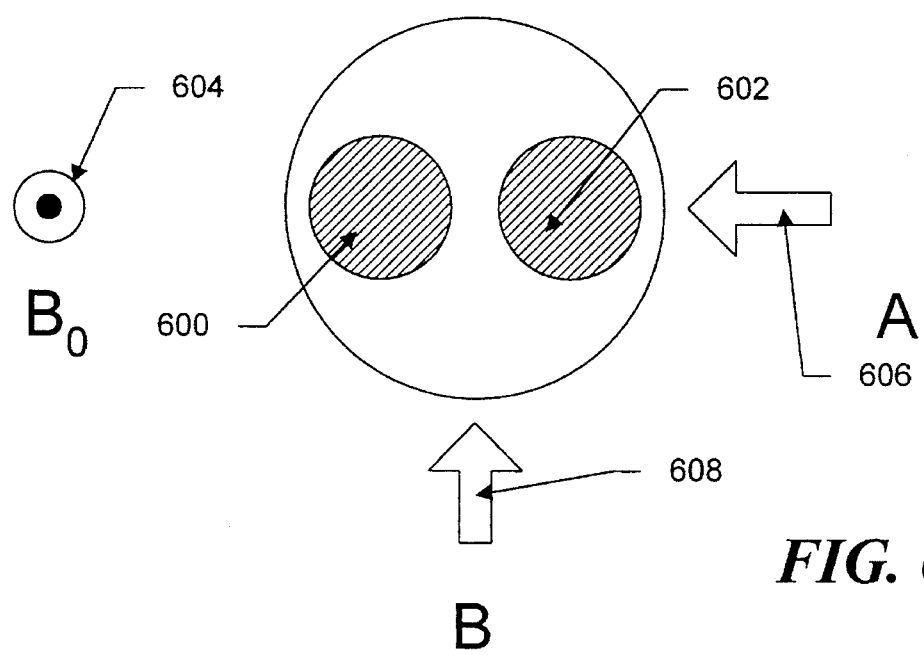
FIG. 6 is a transverse cross section of a test sample for RF-imaging experiments consisting of two capillaries filled with water and aligned parallel to the main magnetic field.

FIG. 6 illustrates an RF imaging experiment performed on a sample containing two capillaries of water 600 and 602, arranged parallel to each other and to the main magnetic field (shown schematically as field $B_0$ and indicated by arrow-head 604). The experiment is performed in a probe which contains, in addition to a homogeneous RF coil, a quadrupolar gradient coil. The geometry of the coil can be modeled by four wires parallel to the z-axis of the laboratory frame. The wires are located at the edges of a square and, in the case of a DC voltage, carry currents which alternate direction in neighboring wires (0°+, 90°−, 180°+, 270°−). This probe is described in detail in U.S. Pat. No. 5,232,113, which is assigned to the same assignee as the present invention. The disclosure of this patent is hereby incorporated by reference.

The gradient RF field generated by the quadrupolar coil has no constant contribution ($B_1^c=0$) and equal x and y gradient components ($G_x=G_y$). A nutation experiment performed with the inventive pulse cycle discussed above ($G_\phi\text{-}\pi)_x\text{-}G_\psi\text{-}G_\psi\text{-}\pi)_{\bar{x}}\text{-}G_\phi$) enables the mapping of the spin distribution in a particular direction in the gradient coil. This direction can be varied by varying the phase of the gradient pulses.

Figure 7:
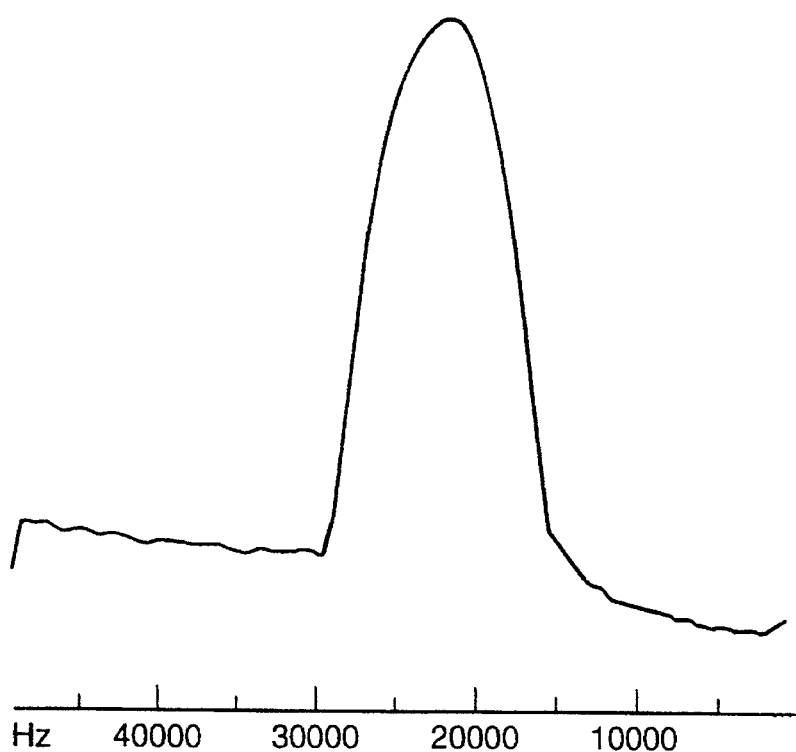
FIG. 7 is an RF-imaging spectrum in the direction A of FIG. 6.

For instance, if the gradient pulse phases are chosen equal ($\phi=\psi$), then the averaged Hamiltonian is proportional to $I_x$. The direction of amplitude variation, and, therefore, the direction of the image, can still be chosen by varying the value of the sum of $\phi$ and $\psi$. If $\phi$ and $\psi$ are both equal to zero, the averaged Hamiltonian is equal to:

$$<H>=-\gamma B_{1g} G_x I_x \quad (17)$$

which results in a nutation spectrum corresponding to a projection of the spin distribution on the x-axis. FIG. 7 shows the nutation spectrum for this case, which corresponds to the imaging direction indicated by arrow A(606) in FIG. 6.

Figure 8:
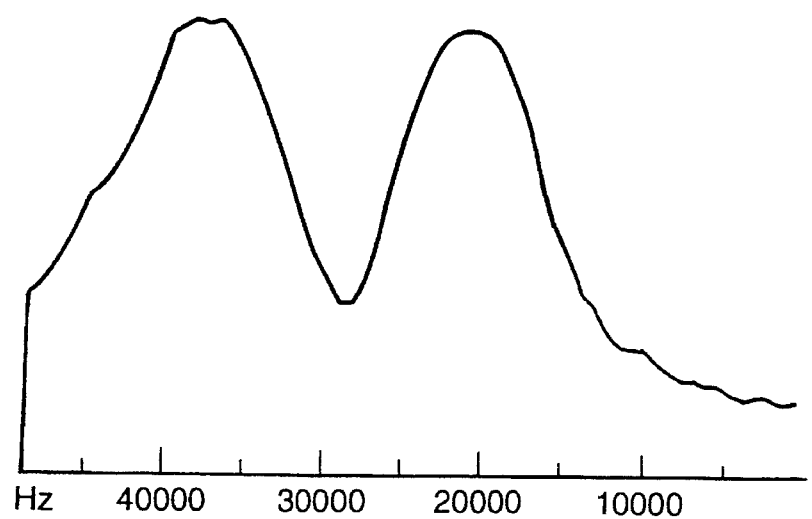
FIG. 8 is an RF-imaging spectrum in the direction B of FIG. 6.

If $\phi$ and $\psi$ are both equal to 90 degrees, then the averaged Hamiltonian is equal to:

$$<H>=-\gamma B_{1g} G_y I_x \quad (18)$$

which corresponds to an imaging direction perpendicular to the previous example. FIG. 8 shows the nutation spectrum for this case, which corresponds to the imaging direction indicated by arrow B (608) in FIG. 6.

In general, any spatial direction and any spin dependence can be obtained, simply by varying the phases $\phi$ and $\psi$ of the gradient pulses. These sequences therefore allow the implementation of any type of NMR experiment involving gradients, such as RF imaging experiments, P/N-type selection in multidimensional experiments, solvent suppression techniques and coherence selection in NMR experiments.

Figure 9:
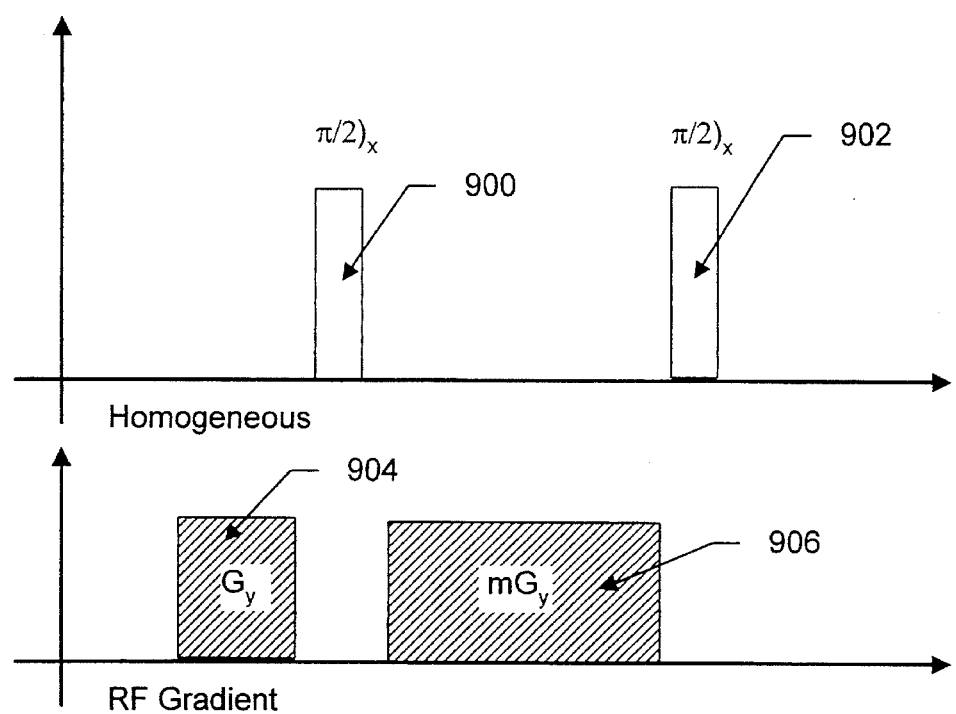
FIG. 9 is the pulse diagram for a variant of a multiple quantum filter involving $B_1$ gradients.
Figure 10:
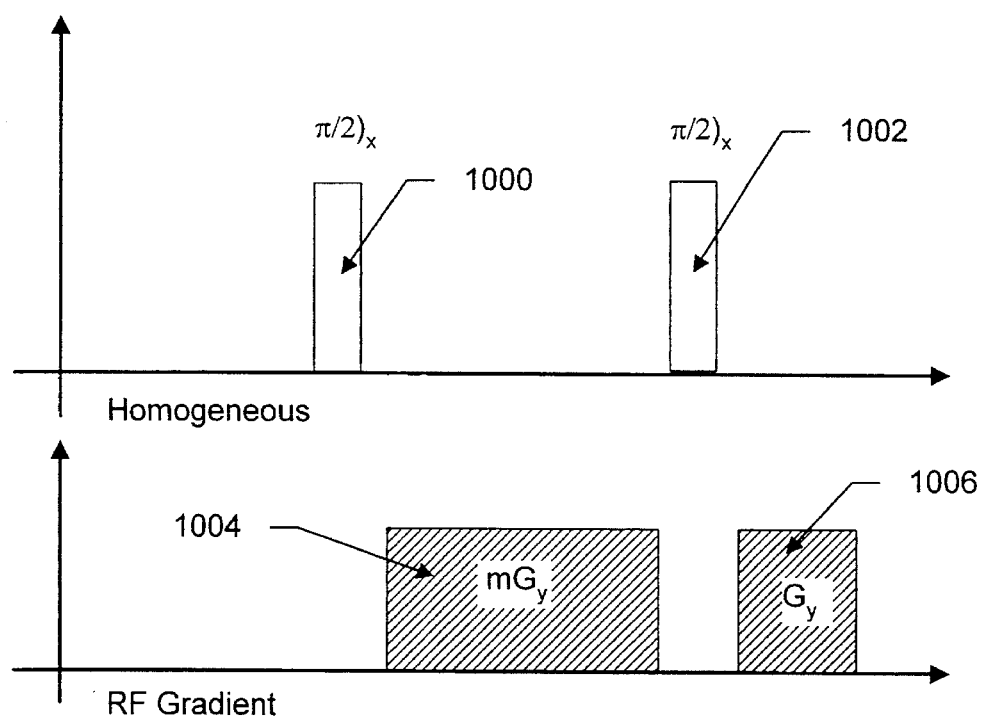
FIG. 10 is a pulse diagram for another variant of a multiple-quantun filter using $B_1$ gradients.

FIGS. 9 and 10 illustrates a third example using the inventive pulse sequences and show two possible multiple quantum filtering sequences that can be incorporated in NMR experiments and that filter out coherences of a certain order. In FIG. 9, the phases of the RF gradient pulses 904 and 906 and the homogeneous RF pulses 900 and 902 are perpendicular to each other and are chosen here, for convenience, to be y and x, respectively. The gradient pulses 904 and 906 are composite pulses, made up from either of the inventive pulse sequences illustrated in lines (11) and (15). The notation $mG_y$ represents m times a certain gradient evolution, achievable by changing either the duration or the amplitude of the gradient pulse. The value of m determines the multiple quantum filtration, so for instance for m=2 the sequence acts as a double quantum filter, for m=3 as a triple quantum filter and so on. The pulse sequences depicted in FIGS. 9 and 10 are not complete pulse sequences, but are applied as part of an NMR pulse sequence in which, prior to the sequences of FIGS. 9 and 10, multiple quantum coherences are created by a combination of RF pulses and free evolution time intervals.

Although only a few illustrative embodiments have been described in some detail, the principles of the invention will immediately suggest other applications. For exmnple, the principles of the invention are applicable in a manner which will be apparent to those skilled in the art to applications including but not limited to other NMR experiments.

What is claimed is:

1. A composite radio-frequency pulse sequence for use in an NMR experiment having a main static magnetic field applied parallel to the z-axis, the pulse sequence generating a gradient magnetic field in the x, y plane, the gradient magnetic field having a spatially-dependent magnitude and a spatially-independent phase, the pulse sequence comprising:

six RF pulses: $G_\phi\text{-}\pi)_x\text{-}G_\psi\text{-}G_\psi\text{-}\pi)_{\bar{x}}\text{-}G_\phi$
   where $G_\phi$ and $G_\psi$ are gradient RF pulses with phases $\phi$ and $\psi$, respectively, and $\pi)_x$ and $\pi)_{\bar{x}}$ are homogeneous RF pulses, with a rotation angle of $\pi$ radians and phases x and −x, respectively.

2. A composite radio-frequency pulse sequence according to claim 1 wherein the gradient RF pulses are radial RF fields.

3. A composite radio-frequency pulse sequence according to claim 1 wherein the gradient RF pulses are general complex RF fields.

4. A composite radio-frequency pulse sequence for use in an NMR experiment having a main static magnetic field applied parallel to the z-axis, the pulse sequence generating a gradient magnetic field in the x, y plane, the gradient magnetic field having a spatially-dependent magnitude and a spatially-independent phase, the pulse sequence comprising:

the sequence $(G_\phi\text{-}\epsilon_x)_n$
   where $G_\phi$ is a gradient RF pulse with phase $\phi$ and $\epsilon_x$ is a homogeneous x-pulse with rotation angle $\epsilon$, and the sequence is repeated n times.

5. A composite radio-frequency pulse sequence according to claim 4 wherein the gradient RF pulses are radial RF fields.

6. A composite radio-frequency pulse sequence according to claim 4 wherein the gradient RF pulses are complex RF fields.

* * * * *